United States Patent [19]
Kim et al.

[11] Patent Number: 6,143,599
[45] Date of Patent: Nov. 7, 2000

[54] METHOD FOR MANUFACTURING MEMORY CELL WITH TRENCH CAPACITOR

[75] Inventors: Byeong Y. Kim, Wappingers Falls; Carl Radens, LaGrangeville; Jochen Beintner, Wappingers Falls, all of N.Y.

[73] Assignee: Infineon Technologies North America Corp., San Jose, Calif.

[21] Appl. No.: 09/235,621

[22] Filed: Jan. 22, 1999

Related U.S. Application Data

[62] Division of application No. 09/162,544, Sep. 29, 1998, abandoned.

[51] Int. Cl.[7] .................................................. H01L 21/8242
[52] U.S. Cl. ............................................. 438/243; 438/386
[58] Field of Search ...................................... 438/243–245, 438/386–392

[56] References Cited

U.S. PATENT DOCUMENTS

| | | | |
|---|---|---|---|
| 5,937,292 | 8/1999 | Hammerl et al. ................... | 438/243 |
| 5,942,778 | 8/1999 | Oikawa ............................. | 438/246 |

*Primary Examiner*—Jey Tsai
*Attorney, Agent, or Firm*—Stanton C. Braden

[57] ABSTRACT

A memory cell includes a transistor and a capacitor that is a doped polysilicon filled trench. A doped polycrystalline strap provides a low resistance connection between a source region of the transistor and the polysilicon fill and is shaped to overlie both a top surface and a side surface of the source region of the transistor.

6 Claims, 11 Drawing Sheets

METHOD FOR MANUFACTURING MEMORY CELL WITH TRENCH CAPACITOR

This is a divisional, of application Ser. No. 09/162,544 filed Sept. 29, 1998 abandoned.

FIELD OF THE INVENTION

This invention relates to dynamic random access memories, and more particularly, to memory cells for use in such memories that use a transistor and a capacitor formed in a vertical trench.

BACKGROUND OF THE INVENTION

Presently the most widely used integrated circuit is the dynamic random access memory (DRAM) and the most common form of memory cell that is assembled in large arrays to form a DRAM comprises a switch, generally a metal-oxide silicon field effect transistor (MOSFET), in series with a capacitor. Binary digits to be stored are written into and read out of the capacitor under control of the switch. A common form of such capacitor comprises a vertical trench in the silicon chip that houses the device, the trench being filled with doped polysilicon, and the fill being isolated from the rest of the chip by a dielectric layer, typically of a silicon oxynitride. A low resistance conductive connection of doped polysilicon, generally called a strap, is provided in the chip between the doped polysilicon fill that serves as the storage node and the one of the two current terminals in the bulk silicon of the MOSFET that shares a storage node, typically described as the source of the MOSFET. It is to be noted that the source and drain of a MOSFET of a memory cell of the type described herein reverse during write-in and read-out operations. In addition, a shallow isolation trench, typically of silicon oxide, isolates from one another individual cells of the array that form the DRAM.

The usual process for forming such a DRAM results in a strap that is buried below the original surface of the chip and so is of reduced effectiveness. Moreover, such process typically requires three polysilicon deposition steps and a chemical mechanical polishing (CMP) with each such deposition step. Moreover, the size of the strap connection is dependent on several steps. To compensate for possible shortcomings in any of these steps, it is customary to be conservative and so the design typically calls for extra depth of the trench, which further complicates the process.

SUMMARY OF THE INVENTION

The present invention in one aspect is a DRAM in which each memory cell includes a novel self-aligned surface and vertical polysilicon strap for providing a conductive interconnection between the source of its MOSFET and the doped polysilicon fill of the trench together serve as the storage node of the memory cell. Additionally, the invention in a related aspect is a novel method of forming the cells of a DRAM to provide its memory cells with such a strap.

The novel method for forming the trench and its strap is essentially as follows. First PAD dielectric layers that generally cover the surface of the wafer are initially patterned to define the position of the vertical trenches adjacent the storage node regions of the silicon wafer in the usual fashion. Then each vertical trench is etched, typically by an anisotropic etch or combination of isotropic and anisotropic etch, in the usual fashion. Then the customary dielectric layer that serves as the capacitor dielectric is formed over the walls of the trench, and the trench is filled with doped polysilicon and then partially emptied to expose a top portion of the side walls of the trench. There is then etched back further the PAD layer to expose more of the surface of the wafer surrounding the trenches. Then an oxide layer (collar) is deposited, typically by CVD, over both the newly exposed surface portion of the wafer and the exposed sidewall portion of the trenches. This is followed by a reactive ion etching step that is controlled to remove the newly formed oxide selectively from the top corner areas of the trenches to expose both horizontal portions of the top surface of the wafer and vertical sidewall portions of the trenches. Then doped polysilicon is again deposited to fill the trenches to overflowing so that some of the new doped polysilicon forms from each trench a strap that makes both a horizontal surface and a vertical side contact with the source region that serves as the storage node of the associated transistor.

The novel memory cells that are so formed in the wafer are each characterized by a doped polysilicon strap that extends between the doped polysilicon fill of its vertical trench and both the top and side surfaces of the source region of the silicon bulk that serves as the storage node of the transistor switch.

From an apparatus aspect, the present invention is directed to a memory cell that includes a transistor in series with a capacitor in which the transistor has a source region in a silicon chip and the capacitor has a storage region that is the conductive fill of a vertical trench in the silicon chip characterized in that a strap, which conductively connects the storage region of the capacitor with the source region, comprises a portion that overlies the top surface of the source region of the transistor and a portion that contacts a side surface of the storage region of the capacitor.

From a method aspect, the present invention is directed to a method forming in a silicon chip a memory cell that includes as a capacitor a polysilicon filled trench and a field effect transistor that includes a source region. The method comprises the steps of: forming over a top surface of the chip a masking layer that has an opening of a first area; forming adjacent the source region of the transistor a trench with vertical side walls and a cross section matching that of the opening in the masking layer; forming a dielectric layer over the surface of the trench for use as the capacitor dielectric; partially filling the trench with doped polysilicon, leaving a top portion unfilled; enlarging the area of the opening in the masking layer for exposing a portion of the top surface of the silicon chip surrounding the trench; forming a dielectric collar over the exposed trench-surrounding portion of the top surface of the chip and the surface of the unfilled top portion of the trench; removing the dielectric collar selectively from a portion of the top surface of the chip surrounding the trench and both the dielectric collar and the dielectric layer from a top portion of the sidewall of the trench; depositing conductive polysilicon both in the unfilled top portion of the trench and over the exposed top surface of the chip surrounding the trench for providing a low resistance connection between the source region of the transistor in the chip and the polysilicon fill in the trench; and removing any deposited polysilicon that makes unwanted low resistance connection to other portions of the chip.

Viewed from another method aspect, the present invention is directed to a method for the manufacture of a dynamic random access memory. The method comprises the steps of: forming at the top surface in a silicon layer first and second spaced regions of one conductivity type and intermediate therebetween a region of the opposite conductive type;

forming a dielectric layer for use as a mask on said top surface; forming an opening in the dielectric mask for defining the location of a vertical trench in the wafer to be adjacent to said second spaced region of one conductivity type; forming a vertical trench in the silicon wafer defined by said opening and adjacent to the second spaced region; forming a dielectric layer on the wall of said trench for serving as the dielectric of a capacitor; partially filling the trench with doped polysilicon, and leaving exposed silicon at the side wall of the unfilled portion; enlarging the opening in the dielectric mask on the top surface of the wafer for exposing a surface portion surrounding the trench; forming a dielectric collar on the exposed side wall of said partially filled trench and on the exposed surface portion surrounding the trench; etching the dielectric collar to expose selectively portions of the top and side surfaces of said second spaced region; depositing doped polysilicon over the top surface of the layer to contact the exposed top and side surface of said second spaced region and to form a conductive connection between the fill in the trench and the second spaced region; and forming a shallow trench of oxide in the silicon layer for isolating the cell from adjacent cells in the layer.

The invention will be better understood from the following more detailed description taken with the accompanying drawing.

DETAILED DESCRIPTION

Figure 1A:
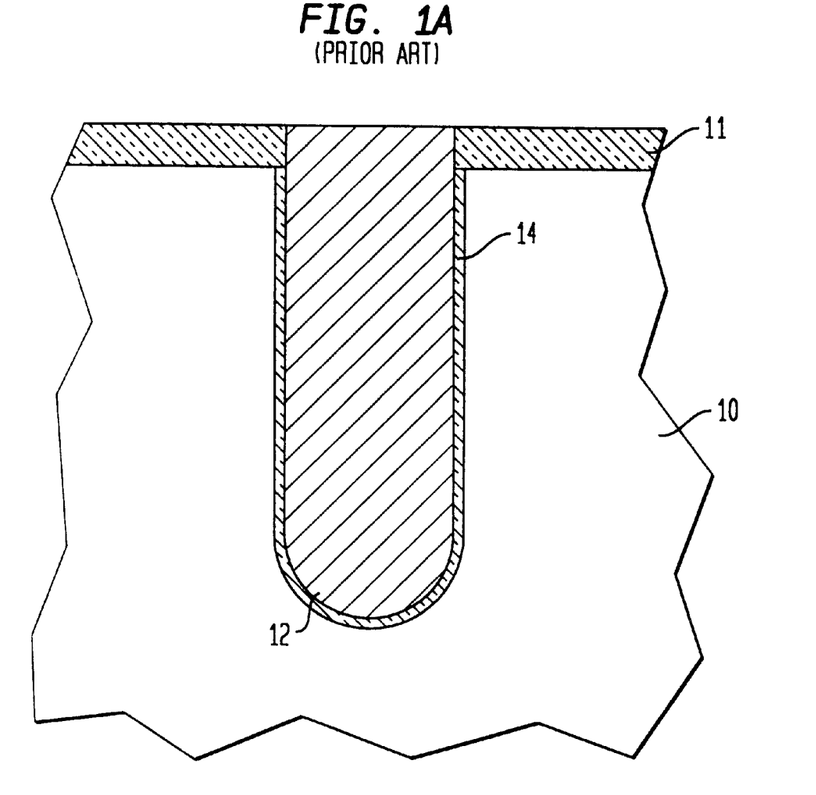
FIGS. 1A–1H illustrate different stages in the formation of a prior art memory cell of the kind that uses a vertical trench for its storage capacitor.
Figure 1B:
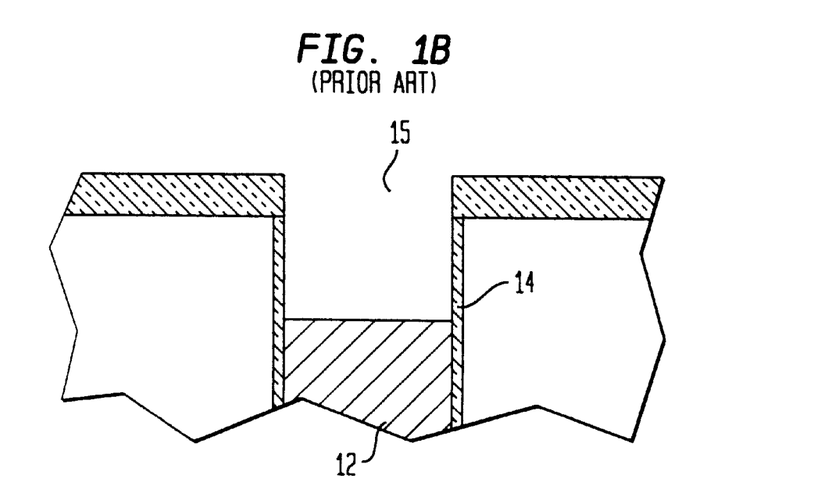
Figure 1C:
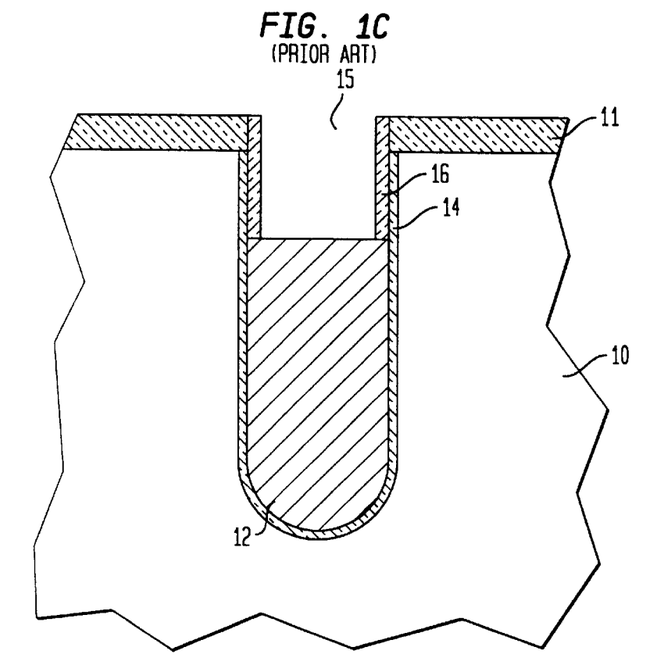
Figure 1D:
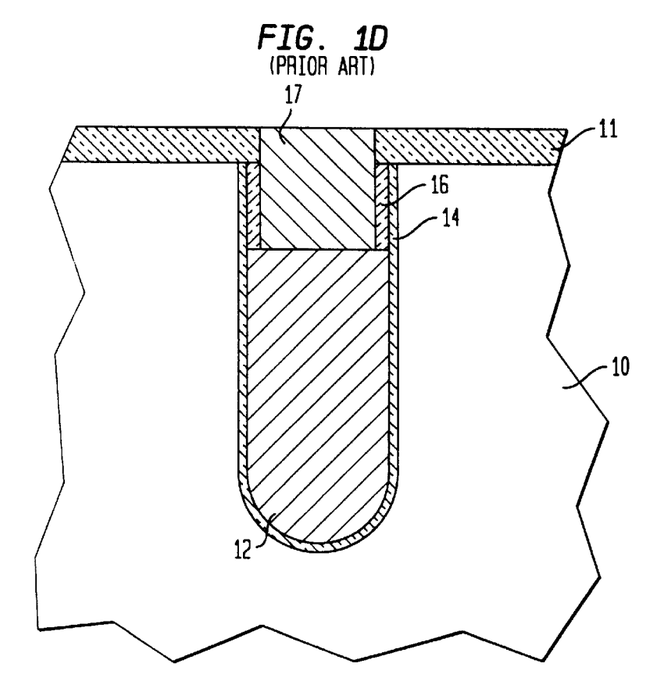
Figure 1E:
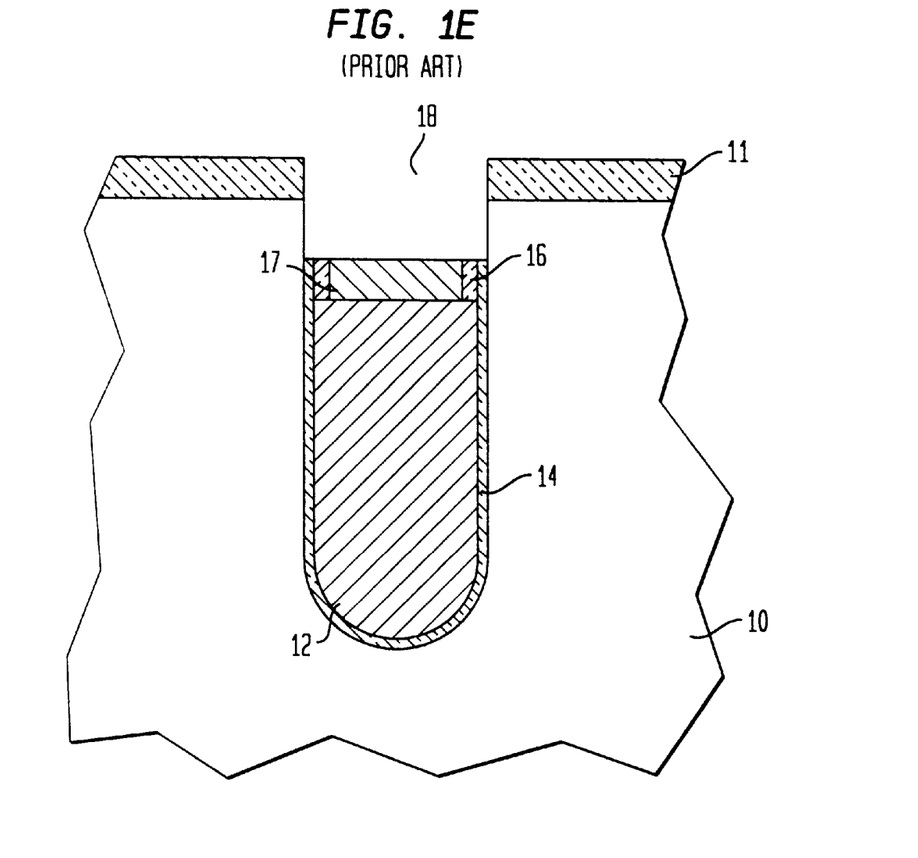
Figure 1F:
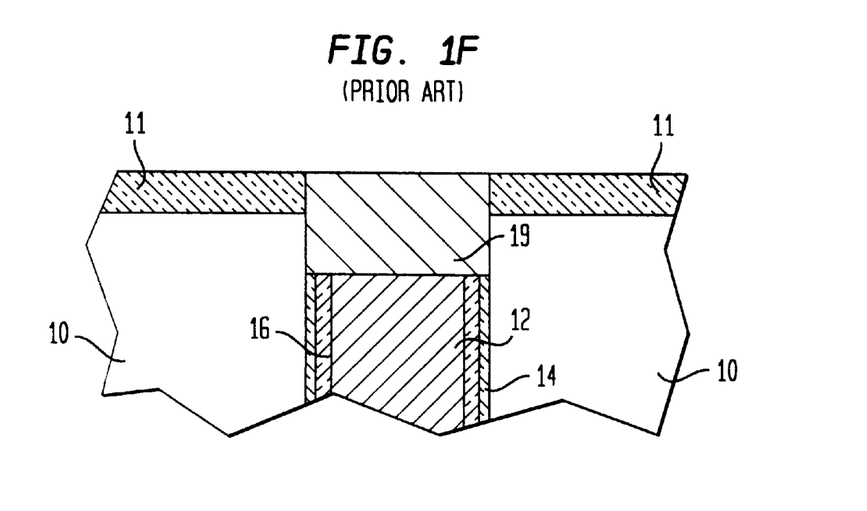
Figure 1G:
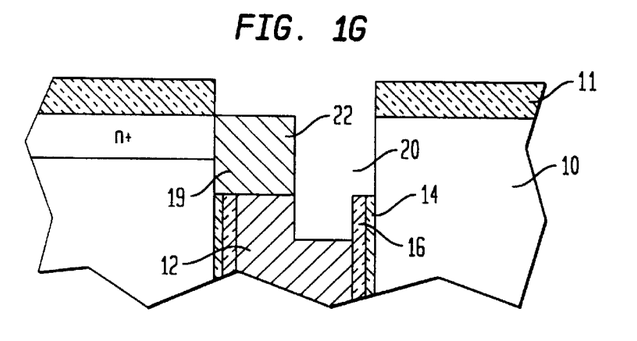
Figure 1H:
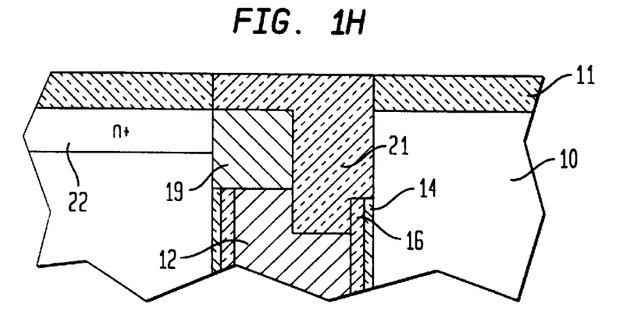

With reference now to the drawing, FIGS. 1A–1H show the basic steps used to form the vertical well and associated strap of the prior art memory cell shown in FIG. 1H. Each of the figures shows essentially only a portion of the chip corresponding to a single memory cell of a DRAM, of which there may be millions in a single silicon chip.

First in normal fashion there is prepared a monocrystalline silicon wafer 10 that has generally been sliced from an ingot of monocrystalline silicon. For an n-channel device, the bulk generally is p-type. Optionally, there may be formed an epitaxial silicon layer over the wafer to provide a top layer of the desired resistivity, in which the transistor will be formed. As still another alternative, the p-type region in which the transistor switch is formed may simply be a large p-type well of appropriate resistivity. In another form, the silicon layer may be formed on an insulator, such as sapphire. There is then formed over the top surface of the wafer a multilayer 11 comprising layers of silicon oxide and silicon nitride and generally described as the PAD layer.

To form the polysilicon-filled vertical trench shown filled with fill 12 in FIG. 1A, the PAD layer 11 is patterned by known photolithographic techniques and the silicon exposed by the pattern is etched either by an anisotropic or combination of anisotropic and isotropic etches to form a vertical trench, shown filled with doped polysilicon fill 12. Before filling, this vertical trench had previously been treated to coat its wall with a dielectric layer 14, typically silicon oxynitride, suitable for use as the capacitor dielectric. Then the trench is filled with doped polysilicon, typically n-type conductivity, for use with an n-channel MOSFET. In practice, the trench is generally overfilled and then the surface is planarized by chemical mechanical polishing (CMP) to level the top surface, as is shown.

Then etching, typically reactive ion etching, is used to form a recess 15 at the top in the polysilicon fill 14 as is shown in FIG. 1B. There is then deposited, typically by chemical vapor deposition (CVD), a relatively thick oxide layer 16 over the exposed side walls in the recess 15. Generally this is done by first coating the entire exposed surface and then using reactive ion etching to remove the oxide from the bottom surface of the recess in the trench and leaving a collar portion 16 as shown in FIG. 1C.

The trench recess 15 is then refilled with doped polysilicon 17 of the same type as the fill 12, as is shown in FIG. 1D. This generally requires overfilling and planarizing by CMP, as before.

Next there is formed a recess 18 in the fill 17 including removal of exposed dielectric in the sidewall of the recess to expose the original silicon bulk at the recess portion 18, as is shown in FIG. 1E.

Next the recess is refilled with doped polysilicon 19, of the same conductivity type as before, that will serve as the conductive strap connecting conductively the fill of the trench to the adjacent silicon bulk 10 as seen in FIG. 1F.

Now there remains to mask the left portion of this fill 19 and then remove the right portion to below the collar 16 to form a void 20, as is shown in FIG. 1G.

Finally, there is provided a shallow trench isolation region 21 that fills the void 20 created by the last etching step, typically by CVD deposition of silicon oxide to overfill the void and then CMP to planarize the surface.

The remaining portion of the conducting fill 19 will form a conductive strap 19 connecting an n-type source region 22 that serves as the storage node of the MOSFET switch to the conductive fill 12 of the trench. Region 22 acts as a source during a write-in operation and becomes a drain during a read-out operation of the memory cell. The n-type region 22 could either have been in place either before or after the vertical trench was formed. It may even been formed in the course of forming the storage capacitor.

It is characteristic of this process that the strap 19 makes only a limited horizontal side contact 22 with the storage region 22 of the switching transistor.

The present invention involves forming a strap connection that should be easier to form while providing desirably a lower series resistance.

Figure 2A:
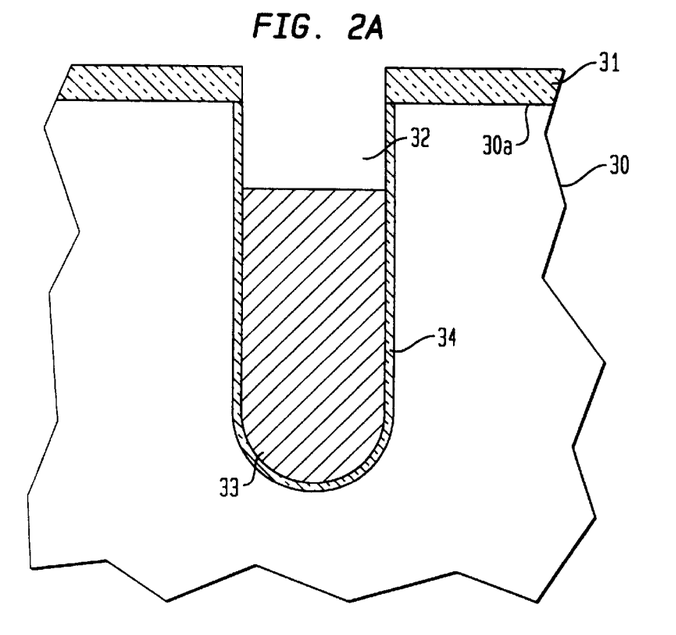
FIGS. 2A–2G illustrate different stages in the formation of one form of memory cell that includes an improved strap connection in accordance with the present invention.

The process of forming a memory cell with the improved strap structure characteristic of the invention will now be described with reference to FIGS. 2A–2G. The process begins as before by forming the structure that is shown in FIG. 2A and that corresponds to that shown in FIG. 1B. It includes a silicon chip 30 having a top surface on which is PAD layer 31 that has been patterned to define the location of a trench 32 that is shown partially filled with doped polysilicon 33 that is electrically isolated from the bulk silicon 30 by a dielectric layer 34 on walls of the trench.

Figure 2B:
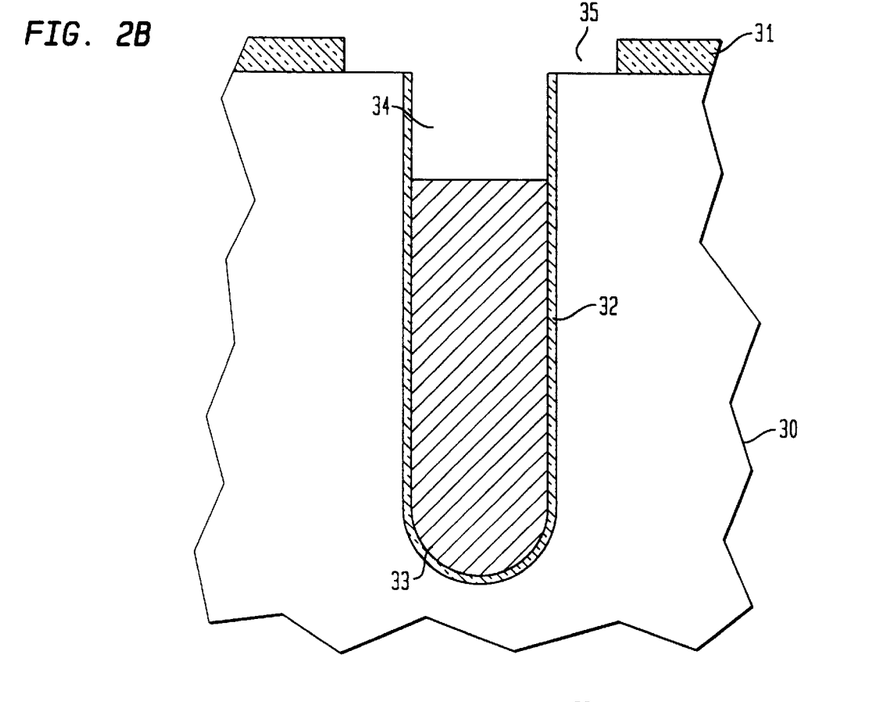
Figure 2C:
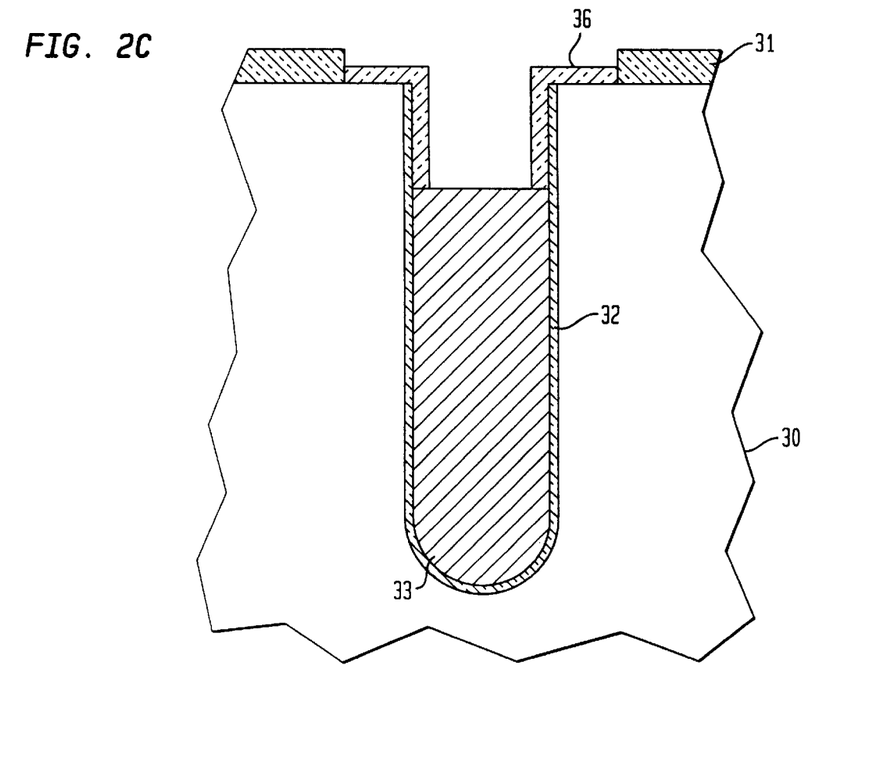

However, as is shown in FIG. 2B, in this novel process before the formation of the collar oxide, the PAD layer 31 is further etched, as by wet etching, to expose an additional ring 35 of the bulk silicon at the top surface of the chip 30 surrounding the vertical trench. Then as is shown in FIG. 2C, a collar oxide 36 is formed not only over the walls of the exposed recess in the trench but also to the edge of the PAD layer 31 and so over the portion of the silicon surface exposed at ring 35. This is typically done by conformal CVD oxide deposition in known fashion.

Figure 2D:
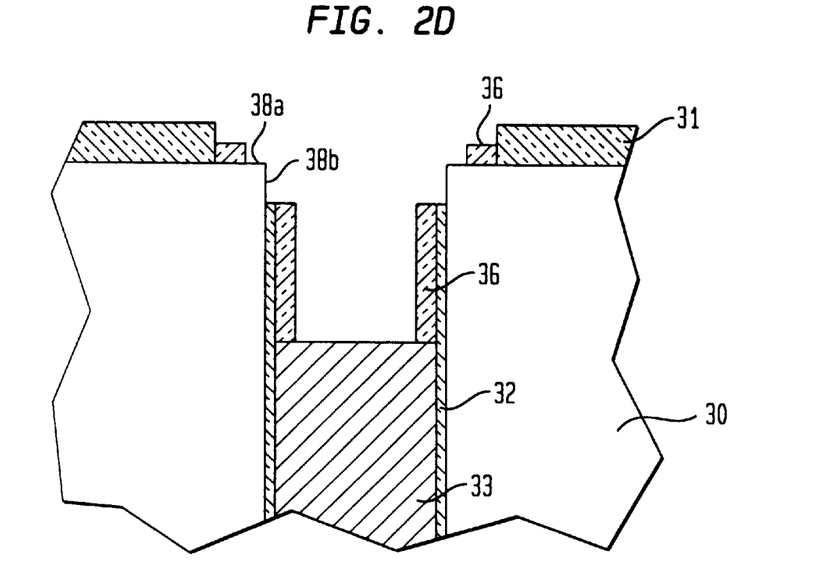
Figure 2E:
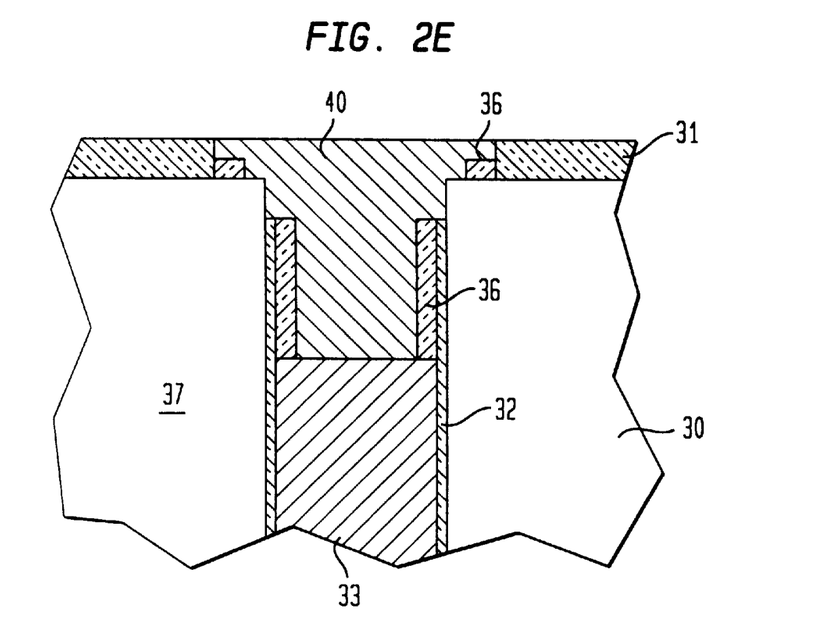

Then, as is shown in FIG. 2D, by the nature of the anistropic RIE process, there is stripped away portions of the silicon oxide collar 36 to leave exposed horizontal portion 38a of the sidewall of the original silicon bulk and vertical portion 38b of the trench. Next in known fashion by CVD, there is deposited doped polysilicon 40 to refill the recess and to extend over the horizontal portion 38A, as is shown in FIG. 2E. Accordingly, there is now doped polysilicon that is an extension of the doped polysilicon fill of the trench and that contacts the storage region of the silicon bulk both horizontally and vertically, as desired, to provide the improved strap connection that was the aim of the new process.

Figure 2F:
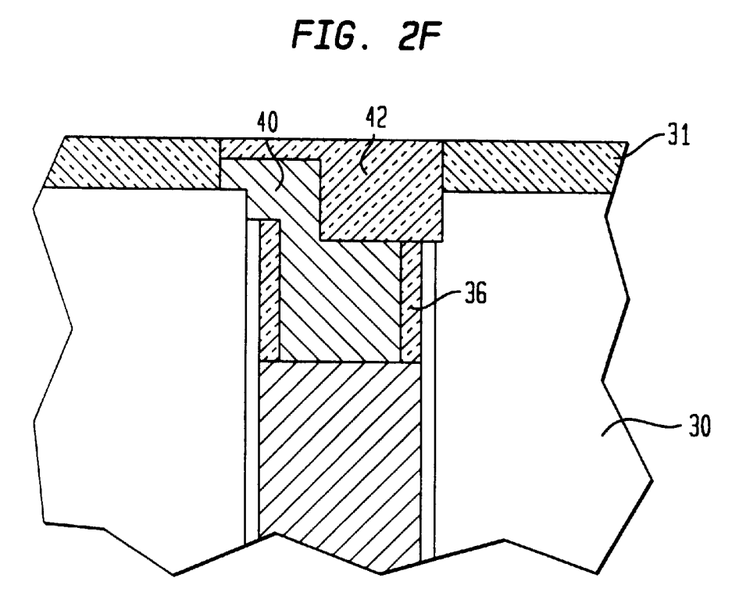

Then, as in the prior art process previously described, shallow trench isolation processing is used to isolate the right top portion of the fill of the trench from the silicon bulk 30 by an silicon oxide filled trench 42, as is shown in FIG. 2F.

Figure 2G:
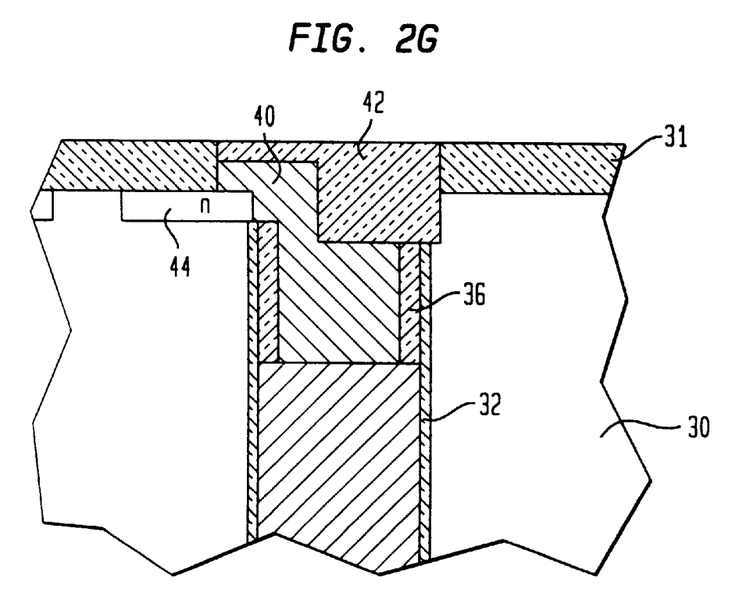

In FIG. 2G there is shown added the n+ type doped source/drain region 44 of the MOSFET in the bulk silicon 30 that contacts the n-type doped strap 40 that has been left at the left side of the trench. As seen, the strap 40 includes both a horizontal portion that overlies the n-type doped region 44 and a vertical portion that is adjacent to the side of region 44.

As discussed, it may be preferable to form the n+ type region 44 before the trench is formed and to locate the trench appropriately so that the later formed strap makes connection to it. In FIG. 2G the shallow trench isolation oxide 42 is shown extending over the top of the strap portion to protect it.

The process just described may be modified by using a collar that has been formed in place by the familiar LOCOS technology and then locating the trench to intersect its thick oxide region.

Figure 3A:
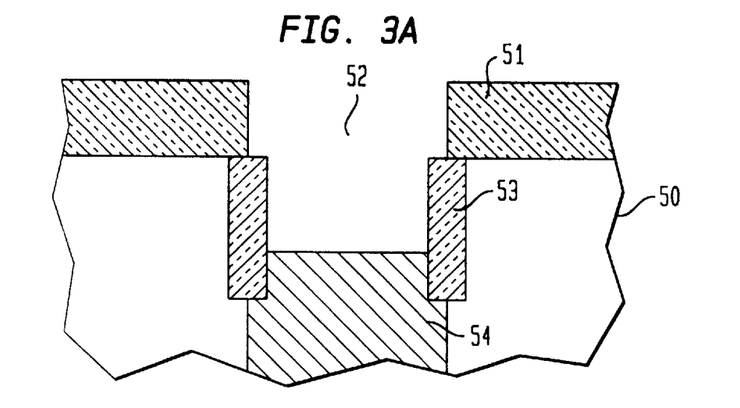
FIGS. 3A–3E illustrate different stages in the formation of another form of memory cell that also includes an improved strap connection in accordance with the present invention.
Figure 3B:
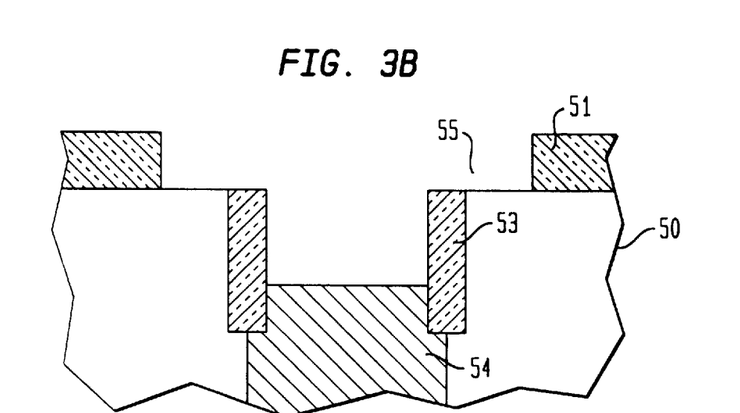
Figure 3C:
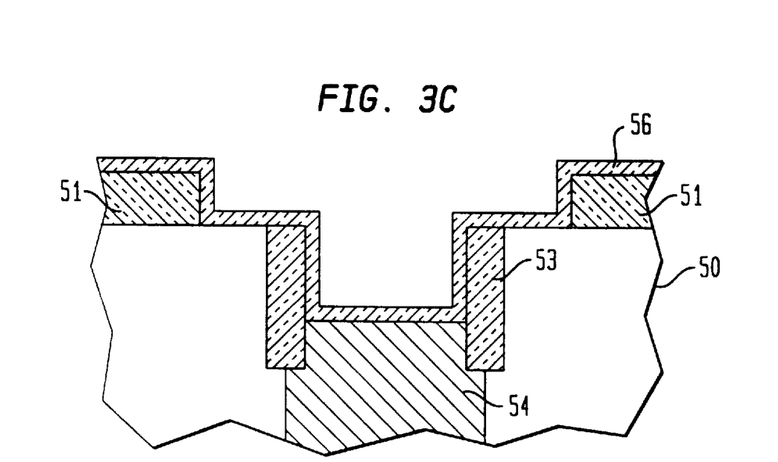

As is shown in FIG. 3A, there has been formed essentially in the way described earlier a structure that includes a silicon chip 50 that includes a surface PAD layer 51 patterned to define a trench 52 that was formed to pass through a local oxidation region whose remains after the trench is formed provide an oxide collar 53 around the top of the trench 52. The trench 52 is shown partially filled with doped polysilicon 54 that can be provided in known fashion. Then, the original PAD opening 51 is enlarged as is shown in FIG. 3B to expose a ring portion 55 of the bulk silicon 50 surrounding the vertical trench. There is then deposited by CVD an additional oxide layer 56 over the exposed surface as is shown in FIG. 3C. The thickness of this layer can be chosen as desired which can be advantageous for further scaling.

Figure 3D:
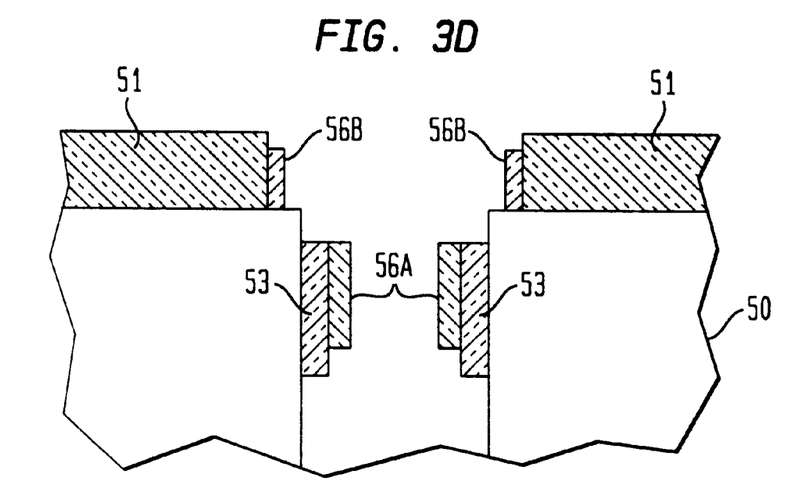

This layer 56 is then etched to leave only the vertical portions along the LOCOS collar in the trench and the PAD layer as is shown in FIG. 3D.

Figure 3E:
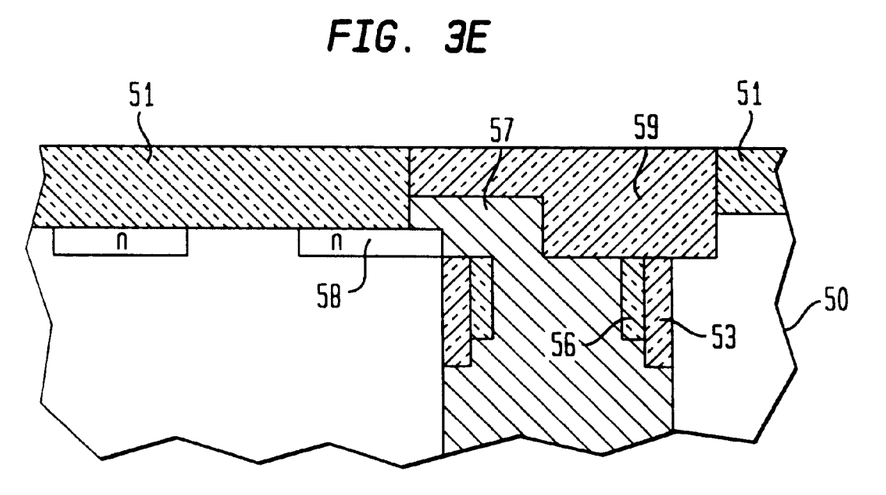

One now proceeds as before. The trench is then refilled with doped polysilicon, as before, to form a strap 57 that merges with the bulk silicon along both horizontal and vertical portions of the storage region portion 58 of the bulk 50. Finally, by suitable masking and CVD deposition of silicon oxide, the right side of the trench can be provided with silicon oxide 59 to provide the necessary isolation from the bulk silicon. In FIG. 3E there is shown the resultant with the strap 57 making contact with n+ type region 58 in the same way as shown in FIG. 2G, both along its top and side surfaces. As in FIG. 2G, the shallow trench isolation oxide 59 advantageously is made to cover the strap 59 and to isolate the right portion of the trench fill from the bulk silicon.

Figure 4A:
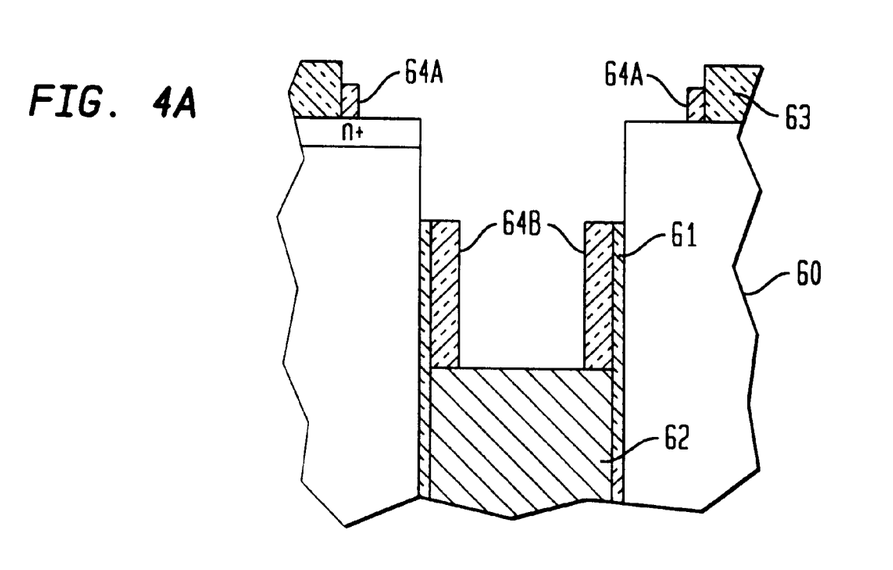
FIGS. 4A–4E illustrate the fabrication of still another embodiment of the present invention.
Figure 4B:
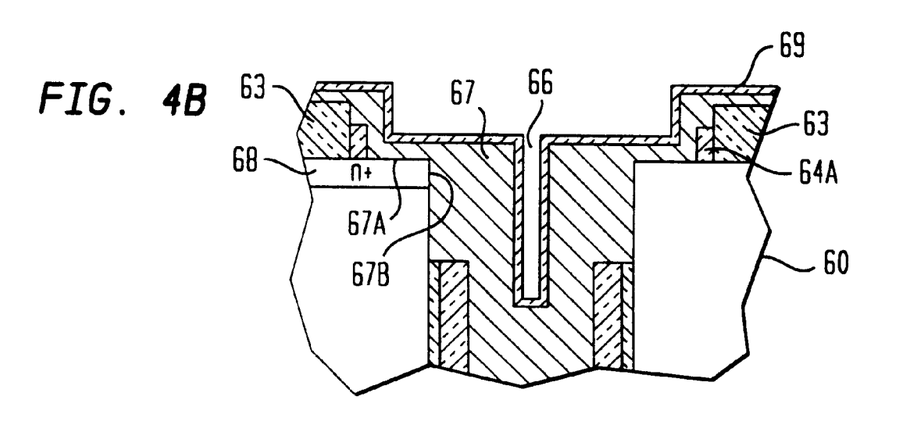

In FIG. 4A there is shown a silicon substrate (body, chip) 60 in which there has been formed a trench 61 that is partially filled with doped polysilicon 62. It further includes a PAD layer 63 that included an opening that defined the vertical trench but that was later enlarged to permit formation of an oxide layer 64 that was patterned to leave only portions 64A anyyyyd 64B along the top surface of the chip and on the top portion of the sidewall of the trench. In these respects, the process is essentially as previously described. This is followed by CVD of a polysilicon region 67 of a thickness such that there remains a void 66 in the trench refill as is shown in FIG. 4B. Polysilicon region 67 provides a strap that includes a portion 67A that overlaps and physically and electrically contacts a top horizontal surface of the n+ type region 68, and a portion 67B that is adjacent to and physically and electrically contacts a side vertical surface of the region 68.

Figure 4C:
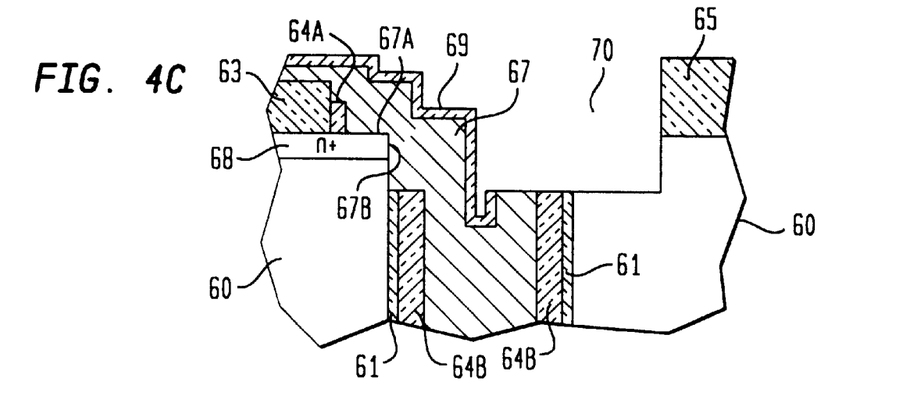
Figure 4D:
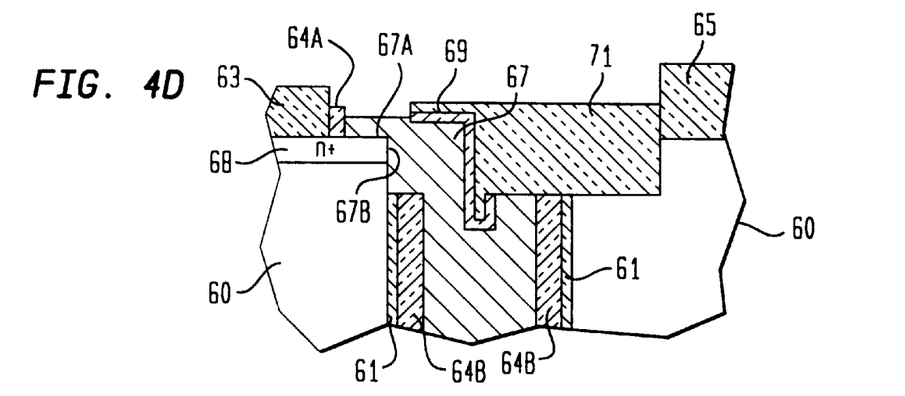
Figure 4E:
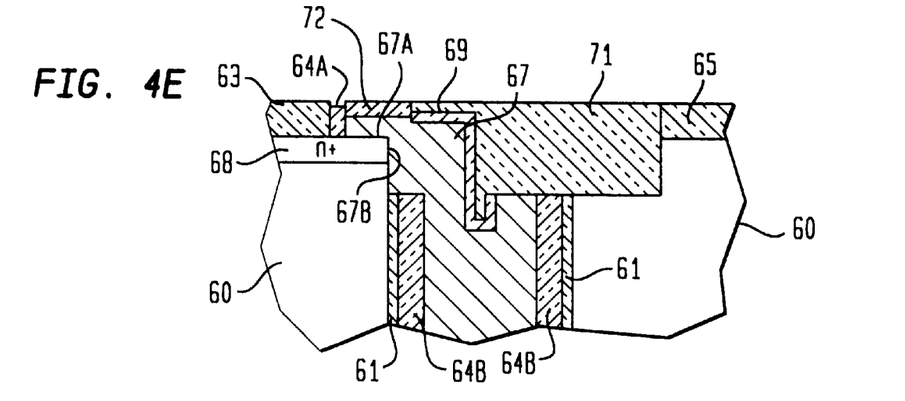

After this step, there is deposited a capping layer of silicon nitride 69 over the exposed surfaces, as is also shown in FIG. 4B. Then a mask is provided over the surface such that when the chip is etched, there is created a void 70 bounded on one side by silicon nitride layer 69 and on a second side by a portion of silicon substrate 60 and a PAD layer 65 as is shown in FIG. 4C. Then the void 70 created is filled with silicon oxide 71, as is shown in FIG. 4D. The device is overfilled with CVD silicon oxide and then planarized for shallow trench isolation and a thermally grown layer of silicon dioxide 72 is formed over an exposed portion of policon region 67 to leave the structure shown in FIG. 4E. In this process, the strap polysilicon CMP process is merged with the CMP process used for the shallow trench isolation to simplify the processing.

It is to be understood that the specific embodiments described are merely illustrative of the general principles of the invention. Other embodiments can be devised by a worker in the art without departing from the spirit and scope of the invention. For example, the invention can readily be modified to use a p-channel MOSFET as the switching transistor in which case the polysilicon fill would be p-type and the bulk silicon n-type.

What is claimed is:

1. A method of forming in a silicon chip a memory cell that includes as a capacitor a polysilicon filled trench and a field effect transistor that includes a source region comprising the steps of:

forming over a top surface of the chip a masking layer that has an opening of a first area;

forming adjacent the source region of the transistor a trench with vertical side walls and a cross section matching that of the opening in the masking layer;

forming a dielectric layer over the surface of the trench for use as the capacitor dielectric;

partially filling the trench with doped polysilicon, leaving a top portion unfilled;

enlarging the area of the opening in the masking layer for exposing a portion of the top surface of the silicon chip surrounding the trench;

forming a dielectric collar over the exposed trench-surrounding portion of the top surface of the chip and the surface of the unfilled top portion of the trench;

removing the dielectric collar selectively from a portion of the top surface of the chip surrounding the trench and both the dielectric collar and the dielectric layer from a top portion of the sidewall of the trench;

depositing conductive polysilicon both in the unfilled top portion of the trench and over the exposed top surface of the chip surrounding the trench for providing a low resistance connection between the source region in the chip and the polysilicon fill in the trench; and removing any deposited polysilicon that makes unwanted low resistance connection to other portions of the chip.

2. The method of claim 1 in which the partial filling of the trench is done by first overfilling the trench and then removing the overfill by chemical mechanical polishing.

3. The method of claim 2 in which, after there is removed the polysilicon that makes unwanted low resistance connection to said other portions of the chip, it is replaced by silicon oxide to provide isolation of the cell from other conducting regions in the chip.

4. The method of claim 3 in which, after the polysilicon is deposited in the unfilled portion of the partially filled trench and over the top portion of the chip surrounding the opening in the trench, there remains a central void in the top portion of the polysilicon fill in the trench.

5. The method of claim 1 in which after the doped polysilicon that is deposited both in the unfilled top portion of the trench and over the exposed top surface of the chip surrounding the trench is removed there remains a doped polysilicon strap that includes a portion that overlies the top surface of the source region and a portion that is adjacent to a side surface of the source region.

6. A method for the manufacture of a dynamic random access memory comprising the steps of:

forming at the top surface in a silicon layer first and second spaced regions of one conductivity type and intermediate therebetween a region of the opposite conductive type;

forming a dielectric layer for use as a mask on said top surface;

forming an opening in the dielectric mask for defining the location of a vertical trench in the wafer to be adjacent to said second spaced region of one conductivity type;

forming a vertical trench in the silicon wafer defined by said opening and adjacent to the second spaced region;

forming a dielectric layer on the wall of said trench for serving as the dielectric of a capacitor;

partially filling the trench with doped polysilicon, and leaving exposed silicon at the side wall of the unfilled portion;

enlarging the opening in the dielectric mask on the top surface of the wafer for exposing a surface portion surrounding the trench;

forming a dielectric collar on the exposed side wall of said partially filled trench and on the exposed surface portion surrounding the trench;

etching the dielectric collar to expose selectively portions of the top and side surfaces of said second spaced region;

depositing doped polysilicon over the top surface of the layer to contact the exposed top and side surface of said second spaced region and to form a conductive connection between the fill in the trench and the second spaced region; and forming a shallow trench of oxide in the silicon layer for isolating the cell from adjacent cells in the layer.

* * * * *

UNITED STATES PATENT AND TRADEMARK OFFICE
CERTIFICATE OF CORRECTION

PATENT NO.    : 6,143,599
DATED         : November 7, 2000
INVENTOR(S)   : Kim et al.

It is certified that error appears in the above-identified patent and that said Letters Patent is hereby corrected as shown below:

<u>Title page,</u>
Item [73], should read as follows:
-- [73]  Assignee: Infineon Technologies North America Corp., San Jose, Calif.
         and International Business Machines Corporation, Armonk, NY --

Signed and Sealed this

Fourth Day of February, 2003

JAMES E. ROGAN
*Director of the United States Patent and Trademark Office*